United States Patent [19]

Moldsvar et al.

[11] Patent Number: 6,166,595
[45] Date of Patent: Dec. 26, 2000

[54] LINEARIZATION TECHNIQUE FOR ANALOG TO DIGITAL CONVERTERS

[75] Inventors: Øystein Moldsvar, Tiller, Norway; Geir Sigurd Østrem, Colorado Springs, Colo.

[73] Assignee: Nordic VLSA ASA, Tiller, Norway

[21] Appl. No.: 09/415,874

[22] Filed: Oct. 8, 1999

[30] Foreign Application Priority Data

Oct. 16, 1998 [NO] Norway .................................... 984867

[51] Int. Cl.[7] ...................................................... H03F 1/02
[52] U.S. Cl. ............................... 330/9; 330/51; 327/124; 341/172
[58] Field of Search .......................... 330/9, 51; 327/124, 327/554; 341/172, 150, 166

[56] References Cited

U.S. PATENT DOCUMENTS

| | | | |
|---|---|---|---|
| 4,210,872 | 7/1980 | Gregorian ..................................... | 330/9 |
| 4,331,894 | 5/1982 | Gregorian et al. ....................... | 307/520 |
| 4,511,851 | 4/1985 | Wurzburg ................................... | 330/51 |
| 4,543,534 | 9/1985 | Temes et al. ............................... | 330/9 |
| 5,410,270 | 4/1995 | Rybicki et al. ............................. | 330/9 |
| 5,479,130 | 12/1995 | McCartney ............................... | 327/341 |

Primary Examiner—Robert Pascal
Assistant Examiner—Henry Choe
Attorney, Agent, or Firm—Marshall, O'Toole Gerstein, Murray & Borun

[57] ABSTRACT

A switched capacitor voltage amplifier having at least one signal input, at least one reference input, an output and a plurality of clock inputs, comprising a high voltage gain (e.g. 100 dB) operational amplifier having an inverting input, a non-inverting input and an output, a plurality of switched capacitors which in the even clock phase are connected between said operational amplifier's inverting input or the switched capacitor's reference input and the switched capacitors amplifier's signal input, in the odd clock phase, however, connecting at least one of said switched capacitors between the operational amplifier's inverting input and the operational amplifier's output while the rest of said switched capacitors being connected between the operational amplifier's inverting input and a reference input, control means for selecting if each of the switched capacitors should be connected to the switched capacitor amplifier's signal input, reference input or output, and a pseudo random binary number generator, clocked by the same clock, clocking the switched capacitor amplifier, thereby controlling said control means such that the voltage gain of the switched capacitor amplifier, averaged over several clock cycles, being exactly equal to a rational number.

6 Claims, 1 Drawing Sheet

LINEARIZATION TECHNIQUE FOR ANALOG TO DIGITAL CONVERTERS

BACKGROUND OF THE INVENTION

The present invention is related to a linearization technique for analog to digital converters (ADC).

The limited ability to implement an amplifier with gain exactly equal to $2^M$, where M is an integer number, limits the achievable linearity of algorithmic and pipelined analog-to-digital converters. Such amplifiers with accurate gain are typically implemented as switched capacitor amplifiers. A switched capacitor amplifier with gain equal to two (X2 amplifier) is shown in FIG. 5. The circuit operates in two phases (FIGS. 1 and 2). In the first phase (sampling phase) the switches labelled $\phi_1$ are closed connecting the input signal to $C_F$ (feedback capacitor) and $C_S$ (sampling capacitor) as shown schematically in FIG. 1. At the end of the phase the capacitors are disconnected leaving the input voltage stored on each capacitor. In the second phase (amplification phase) the switches labelled $\phi_2$ are closed as shown schematically in FIG. 2. All charge stored on $C_S$ will be transferred to $C_F$ resulting in the transfer function shown in equation (1) if an infinite operational amplifier open-loop gain is assumed.

$$\text{gain} = (C_S + C_F)/C_F \quad (1)$$

The gain becomes exactly equal to 2 if $C_S$ and $C_F$ are exactly equal. The accuracy of the gain is limited by the capacitor matching that can be obtained with current technology. During one clock cycle, the sampling phase is performed before an amplification phase. For normal operation in a high-speed ADC, the X2 amplifier therefor will alternate between the sampling phase and the hold phase.

Several principles have been proposed to enhance the performance of the X2 amplifier. The mismatch problem is known to be solved by using the same capacitor both for sampling and feedback. This is accomplished by sampling the input twice and transferring the charge back and forth from an extra capacitor. Four operational amplifier (op amp) settling-time periods are required in this solution, and the obtainable conversion rate would therefore be reduced by at least a factor of two.

In FIG. 6 the same configuration as in FIG. 5 is used, except that the circuit is connected so that both $C_S$ and $C_F$ can be used as feedback capacitor. If the capacitances of $C_S$ and $C_F$ are different by a certain percentage, the gain will become higher than two or lower than 2 depending on which of the capacitors is selected as feedback capacitor, cf. equation 1. It is known from prior art to use the value of the input signal $V_{in}$, to determine if $C_S$ or $C_F$ should be used as feedback capacitor. When this configuration is used in a so-called pipeline ADC, having several amplifiers, their gain is dependent on the input voltage, hence harmonic distortion in the system results. Therefore this approach cannot improve the distortion of the ADC, measured by the parameters SFDR (spurious free dynamic range), THD (total harmonic distortion) for full scale input signals. The DNL (differential nonlinearity) of the converter is improved.

SUMMARY OF THE INVENTION

Substantial improvements are achieved with the linearization technique according to the present invention as defined by the features of the claims.

FIG. 1 discloses schematically gain-of-2 amplifiers with $C_F = C_S$ in the sampling phase, FIG. 2 corresponds with FIG. 1, however in the amplification phase, FIG. 1 again discloses schematically gain-of-2 amplifiers with $C_F = C_S$ and linearization technique in the sampling phase, FIG. 3 corresponds with FIG. 1, however in the amplification phase, FIG. 4 discloses gain-of-2 amplifiers and $C_F = C_S$ where $C_F$ and $C_S$ is divided into N=2 unity capacitors in the sampling phase, FIG. 5 discloses a switched capacitor implementation of gain-of-2 amplifier and FIG. 6 discloses a gain-of-2 amplifier with feedback capacitor selected by $D_S$.

DETAILED DESCRIPTION

Figure 1:
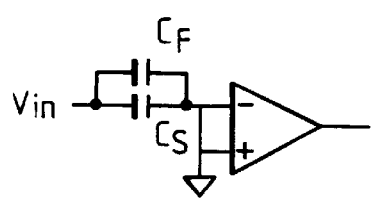
FIG. 1 depicts an amplifier with $C_F = C_S$ in the sampling phase.
Figure 2:
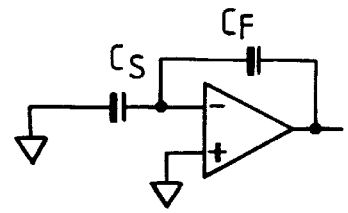
FIG. 2 depicts an amplifier in the amplification phase.
Figure 3:
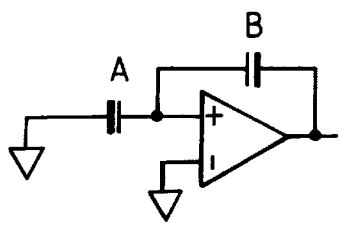
FIG. 3 depicts an amplifier in the amplification phase.
Figure 6:
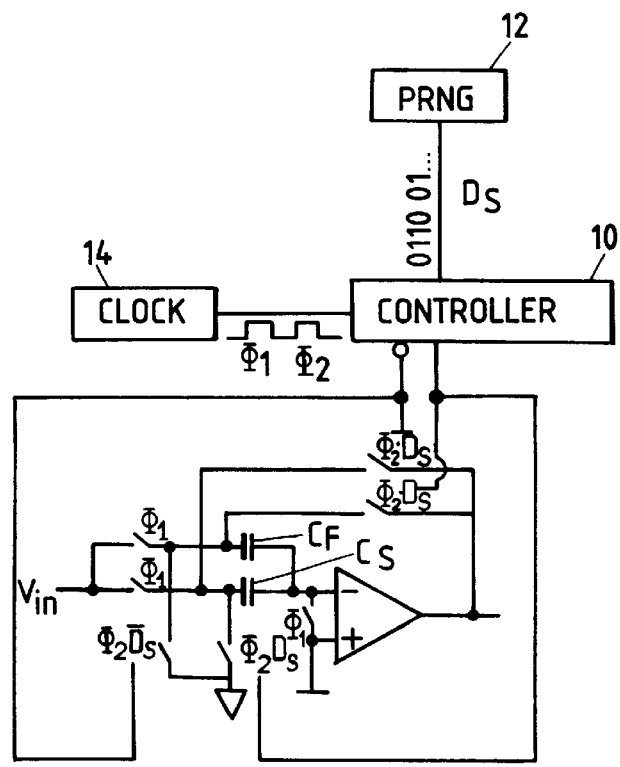
FIG. 6 depicts an amplifier with feedback capacitor selected by $D_S$.

The ADC linearization technique according to the present invention can be employed in the X2 amplifier as shown schematically in FIGS. 1, 3 and 6. A in FIG. 3 corresponds with $C_F$ with a digital signal, $D_S$ equal to zero and with $C_S$ if $D_S$ is equal to one. Correspondingly B in FIG. 3 corresponds with $C_S$ if $D_S$ is equal to zero and with $C_F$ if $D_S$ is equal to one. Appropriate control means 10 uses the state of the digital signal $D_S$, generated by a pseudo random binary number generator (PRNG) 12, to determine if $C_S$ or $C_F$ is used as feedback capacitor, so that the choice between $C_S$ and $C_F$ is determined for each clock cycle 14. During normal operation the circuit will alternate between the sampling phase and the amplification phase. Before each amplification phase, the PRNG 12 selects a random value (O or 1) for $D_S$, which determines if $C_S$ or $C_F$ is used as feedback capacitor. FIG. 6 shows a possible implementation of a circuit with control means 10 selecting feedback capacitor determined by a $D_S$ input signal. The PRNG output signal must have no correlation to the input signal, $V_{in}$, and it must be symmetrical. In this context symmetrical means that during a certain number of clock cycles 14, the number of times $C_S$ and $C_F$ are used as feedback capacitor must be equal. The output of the PRNG 12 may be "white" (fully random) or it may have given spectral properties depending on the application. If $C_F$ and $C_S$ are different by a given percentage, the gain will be higher than 2 and lower than 2 for the same number of clock cycles 14 (see equation 1). The linearization technique therefore significantly reduces the average gain error. Since the PRNG output is uncorrelated to the input signal, the systematic gain error caused by capacitor mismatch is eliminated and replaced by noise having a frequency characteristic independent of the input signal.

The invention is used in systems where the distortion performance is limited by component matching limitations. Examples of such systems are analog-to-digital and digital-to-analog converters. The operation of such circuits is based on the following principle. Several sets of components where the sum of the component values in each set are a multiple of (or equal to) the sum of the values in the other sets are used to implement a given transfer function. The accuracy of the transfer function is limited by the matching of the component values. Examples of such systems are found in prior art.

The invention is based upon this linearization technique and gives practical solutions to linearity problems by improving the performance of such systems in the following way. The components in the matched sets are interchanged between the sets as a function of time and in a manner that is uncorrelated with the input signal and the state of the system clock (eg. random component interchange). The component interchange must be performed so that the time average of the sum of the component values in each set are matched exactly to each other. The linearization technique then eliminates signal dependent errors and replaces these errors with a noise with no correlation to the input signal.

Figure 4:
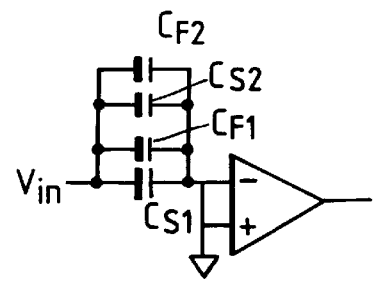
FIG. 4 depicts an amplifier with $C_F = C_S$ and where $C_F$ and $C_S$ are divided into N=2 unity capacitors in the sampling phase.
Figure 5:
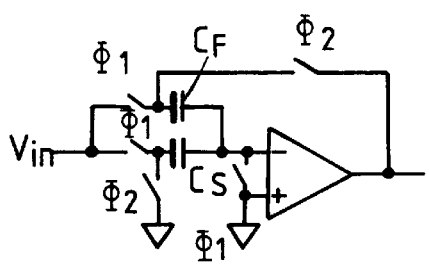
FIG. 5 depicts a switch capacitor amplifier.

The scheme can be extended by splitting $C_S$ into N equal size capacitors and $C_F$ into N equal size capacitors, resulting in a capacitor array with 2N capacitors (see FIGS. 4 and 3). In the sampling phase the input signal is sampled onto all 2N capacitors in parallel. In the amplification phase, N capacitors selected by the digital signal Ds are connected in the feedback path of the operational amplifier.

Combinations of $C_F$ and $C_S$ in figure 3:

| $D_S$ signal | A | B |
|---|---|---|
| 0 | $C_{F1} + C_{F2}$ | $C_{S1} + C_{S2}$ |
| 1 | $C_{S1} + C_{S2}$ | $C_{F1} + C_{F2}$ |
| 2 | $C_{F1} + C_{S1}$ | $C_{F2} + C_{S2}$ |
| 3 | $C_{F2} + C_{S2}$ | $C_{F1} + C_{S1}$ |
| 4 | $C_{F1} + C_{S2}$ | $C_{F2} + C_{S1}$ |
| 5 | $C_{F2} + C_{S1}$ | $C_{F1} + C_{S2}$ |

The linearity averaged over many A/D-conversions of a pipelined ADC based on the known circuit in FIG. 1 can be improved by the linearization technique. Capacitor mismatch in a pipeline ADC increases the linearity error of the converter due to gain errors. This results in harmonic distortion. The linearization technique therefore randomizes the error and distributes the energy of the harmonic components over the entire sampled frequency spectrum if the digital signal Ds is random and uncorrelated with the input signal. In this way harmonic errors are eliminated and converted to signal independent white noise. This results in a significant improvement in SFDR and THD at the expense of a slight reduction in SNR.

The linearization technique can also be adapted to other circuit topologies whose function is based on matching of any electronic component.

What is claimed is:

1. A switched capacitor voltage amplifier having at least one signal input, at least one reference input, an output and a plurality of clock inputs, a high voltage gain operational amplifier having an inverting input, a non-inverting input and an output, a plurality of switched capacitors which in the even clock phase are connected between said operational amplifier's inverting input or the switched capacitor's reference input and the switched capacitors amplifier's signal input, in the odd clock phase, wherein at least one of said switched capacitors is connected between the operational amplifier's inverting input and the operational amplifier's output while the rest of said switched capacitors are connected between the operational amplifier's inverting input and a reference input, wherein control means for selecting if each of the switched capacitors should be connected to the switched capacitor amplifier's signal input, reference input or output, and a pseudo random binary number generator, clocked by the same clock, clocking the switched capacitor amplifier, thereby controlling said control means such that the voltage gain of the switched capacitor amplifier, averaged over several clock cycles is exactly equal to a rational number.

2. Amplifier according to the preceding claim, wherein the reference input is ground.

3. Amplifier according to claim 1, wherein the amplifier is implemented in a differential or balanced way.

4. Amplifier according to claim 1, wherein the random number generator has a spectrally shaped output signal.

5. A pipelined analog to digital converter where the amplifier according to claim 1 is used as an interstage gain amplifier, to achieve an accurate interstage voltage gain, averaged over several A/D-conversions.

6. An algorithmic or recycling analog-to-digital converter where the amplifier according to claim 1 is used as a residue amplifier.

* * * * *

UNITED STATES PATENT AND TRADEMARK OFFICE
CERTIFICATE OF CORRECTION

| | |
|---|---|
| PATENT NO. : 6,166,595 | Page 1 of 1 |
| DATED : December 26, 2000 | |
| INVENTOR(S) : Moldsvor et al. | |

It is certified that error appears in the above-identified patent and that said Letters Patent is hereby corrected as shown below:

<u>Title page,</u>
Item [75], the first inventor's last name should be -- Moldsvor --.

Signed and Sealed this

Eighteenth Day of September, 2001

Attest:

*Nicholas P. Godici*

NICHOLAS P. GODICI
*Attesting Officer*  *Acting Director of the United States Patent and Trademark Office*